United States Patent
Banfield et al.

(10) Patent No.: US 10,400,895 B2
(45) Date of Patent: Sep. 3, 2019

(54) SLIDING ELEMENT

(71) Applicants: Mahle Metal Leve S/A, Jundiai (BR); Mahle International GmbH, Stuttgart (DE)

(72) Inventors: Robert Richard Banfield, Sao Paulo (BR); Juliano Avelar Araujo, Jundiai (BR)

(73) Assignees: Mahle Metal Leve S/A (BR); Mahle International GmbH (DE)

( * ) Notice: Subject to any disclaimer, the term of this patent is extended or adjusted under 35 U.S.C. 154(b) by 125 days.

(21) Appl. No.: 15/289,097

(22) Filed: Oct. 7, 2016

(65) Prior Publication Data

US 2017/0102071 A1   Apr. 13, 2017

(30) Foreign Application Priority Data

Oct. 8, 2015   (BR) .............................. 102015025731

(51) Int. Cl.
  *F16J 9/26*   (2006.01)
  *C23C 16/26*  (2006.01)

(52) U.S. Cl.
  CPC ................. *F16J 9/26* (2013.01); *C23C 16/26* (2013.01)

(58) Field of Classification Search
  USPC ...... 428/141, 156, 336, 408, 457; 123/193.6; 277/442
  See application file for complete search history.

(56) References Cited

U.S. PATENT DOCUMENTS

| | | |
|---|---|---|
| 6,528,115 B1 | 3/2003 | Hirano et al. |
| 9,086,148 B2 | 7/2015 | Kennedy |
| 2012/0068418 A1* | 3/2012 | Hoppe ................. C23C 14/0605 277/442 |
| 2013/0043659 A1 | 2/2013 | Ito et al. |
| 2013/0140776 A1 | 6/2013 | Kennedy |
| 2013/0199331 A1* | 8/2013 | Himsel ................ C23C 14/0605 74/569 |
| 2015/0275120 A1 | 10/2015 | Lehnert et al. |

FOREIGN PATENT DOCUMENTS

| | | |
|---|---|---|
| DE | 102011003254 A1 | 8/2012 |
| DE | 112011100377 T5 | 12/2012 |
| DE | 102012020757 A1 | 5/2014 |
| JP | 2004-137535 * | 5/2004 |

(Continued)

OTHER PUBLICATIONS

Xiao et al "Rolling and rolling-to-sliding contact behaviour of DLC coatings" Trilogoy and Unteface Eng. Series vol. 48, (2005) p. 213-220. (Year: 2005).*

(Continued)

*Primary Examiner* — Archene A Turner
(74) *Attorney, Agent, or Firm* — Fishman Stewart PLLC

(57) ABSTRACT

A sliding element for internal combustion engines may include a sliding face upon which are deposited, from the sliding face outwards, an adhesive layer and a coating of hard amorphous carbon. The coating may present a proportion of $sp^3$ to $sp^2$ ranging from 0.42 to 2.33 and at least one of an Rmr (0.2-0.5) profile greater than at least 25% and/or an Rmr (0.3-0.5) profile greater than at least 50%.

20 Claims, 3 Drawing Sheets

(56) References Cited

FOREIGN PATENT DOCUMENTS

| | | | |
|---|---|---|---|
| JP | 2011-179573 | * | 9/2011 |
| WO | WO-2010133633 A1 | | 11/2010 |

OTHER PUBLICATIONS

Nagata et al "Porperties of Tetrahedral Amorphous Carbon Films Deposited by the Filtered Cathodic Arc Method" Mat. Res. Soc. Symp. Proc. vol. 750 p. Y5.16.1-Y516.6 (Year: 2003).*

Search report for DE-102016217557.2, dated Jul. 25, 2017.

Norm DIN EN ISO 4287 2010-07-00. Geometrische Produktspezifikation (GPS)—Oberflachenbeschaffenheit: Tastschnitlverfahren—Benennungen, Definitionen und Kenngr6U,en der Oberflachenbeschaffenheit (ISO 4287: 1997 + Cor 1: 1998 + Cor 2:2005 + Amd 1 :2009); Deutsche Fassung EN ISO 4287:1998 + . S. 1-27.

* cited by examiner

SLIDING ELEMENT

CROSS-REFERENCE TO RELATED APPLICATIONS

This application claims priority to Brazilian Patent Application No. 10 2015 025731 7, filed on Oct. 8, 2015, the contents of which are hereby incorporated by reference in their entirety.

TECHNICAL FIELD

The present invention relates to the sliding element, such as a piston ring for internal combustion engines, comprising a coating of hard amorphous carbon provided with a roughness profile capable of bringing about a diminution of the friction on the sliding interface thereof, together with diminishing wear.

BACKGROUND

Internal combustion engines, whether of Diesel cycle, Otto cycle, two or three stroke, comprise at least one sliding element such as a piston ring.

In this respect, the piston ring acts in the sealing of the space between the cylinder liner and the body of the piston, isolating the combustion chamber from the other internal components of the engines. The piston ring is disposed radially upon the base of the body of the piston, preventing the combustion gases from escaping from the combustion chamber towards the sump and preventing the engine oil from penetrating into the combustion chamber.

Some internal combustion engines, principally engines operating with the Diesel cycle, work with high loads. Other examples may be found in high performance petrol engines. Independently of the examples which may be cited, there is a trend for engines to operate at high speed with high power, reduced clearances and, consequently, subject to a severe tribological regime. Such conditions are naturally more exacting upon the mechanical components thereof. In this respect, the rings utilized in these high power or performance engines require low friction, high hardness and high wear resistance.

In addition, it is important to stress that the environmental impact of internal combustion engines, when taken together with the great need for performance and durability, results in a general manner in the need to work with tighter tolerances which, naturally, is translated into the utilization of increasingly thin layers of lubricating oils. As will be seen hereinafter, the present invention has been specifically developed to offer a solution the excellent performance whereof flows from the utilization of predominantly less viscous oils.

The piston rings of the state of the art generally comprise coatings of hard amorphous carbon, also known as DLC (diamond like carbon) or hydrogenated DLC nanostructure free of hydrogen, as a solution for achieving low friction and high wear resistance.

In general, the solutions of the state of the art apply the coating of DLC in a composition incorporating $sp^3$ and $sp^2$ bonds. Nevertheless, it must be noted that by virtue of the high dimensional stability of the $sp^3$ bonds, the hardness thereof exceeds that found with the $sp^2$ bonds. For this reason, diverse solutions of the state of the art make use of a DLC layer of $sp^3$ (diamond type) coated with a thin layer of $sp^2$ (graphite type).

For a better understanding, the $sp^2$ layer, by virtue of being very soft and lubricant, is utilized to permit the bedding in of the ring within the cylinder liner and preventing the $sp^3$ layer from entering directly into contact with the cylinder liner. Such concern is extremely valid, by virtue of the fact that, in addition to the fact that the $sp^3$ layer may score the cylinder liner, the concentration of stresses present in the $sp^3$ layer is very high such that it may generate disastrous consequences both for the cylinder liner, scoring it, and for the coating, wherein cracks and the propagation thereof may occur, consequently leading to the diminution in the working life of the engine.

The patent document WO 2010133633 reveals a piston ring provided with a DLC coating of the ta-C type having a thickness exceeding 10 micrometers and having at least one residual stress gradient to endow durability and low friction upon the component. It is to be noted that the high internal stresses inherent in the deposition of a DLC coating result in the necessity of finding solutions in this technological field. Nevertheless, even reducing the residual stress, the solution does not fully resolve the problem by virtue of the fact that the contact interface of the ring with the liner continues to occur by means of a profile which does not ensure, for example, that the cylinder liner does not suffer the wear typical of the solutions of the state of the art.

The document U.S. 2013/0140776 describes a piston ring provided with a DLC coating of the ta-C type having a thickness also exceeding 10 micrometers, the coating containing a finishing layer having a thickness from 1 to 3 micrometers wherein the quantity of $sp^3$ decreases to values of less than 40% with a view to ensuring that a greater quantity of $sp^2$ is present in this second layer for the bedding in of the ring within the cylinder.

Whilst the solutions of the state of the art are concerned with ensuring low friction and high durability, all the solutions found require an interface or presence of elements bringing about the bedding in, such as a softer layer in the sliding region of the ring, or the addition of metals bringing about such effects. Furthermore, there are alternatives in the state of the art, through the reduction of the internal stresses, to maintain the functional integrity of the coating in view of the high internal stresses and high hardness to which the coating is subject.

Independently of the efforts revealed by the documents of the prior art, a solution has still not been found generating excellent results in the finished product, i.e. a piston ring not requiring bedding in within in the respective cylinder liner and which, simultaneously, works with very small clearances.

Consequently, it is necessary to find a sliding element, such as a piston ring, comprising a coating of hard amorphous carbon of the ta-C type provided with a roughness profile capable of bringing about a reduction of the friction in the sliding interface thereof, together with diminishing the wear.

SUMMARY

The object of the present invention is to provide a sliding element, such as a piston ring for internal combustion engines, particularly engines operating with high load and/or power, the ring comprising a coating of amorphous carbon provided with a roughness profile capable of bringing about a reduction in the friction in the sliding interface thereof, together with diminishing the wear both of the piston ring and of the cylinder liner by means of a reduction in the peaks and maximization of the valleys.

Additionally, an object of the present invention is to provide a piston ring provided with a coating capable of working with very small clearances and a thin film of oil having high durability.

Furthermore, an object of the present invention is to provide a piston ring capable of working with very small clearances and an oil film.

Finally, an object of the present invention is to provide a piston ring comprising a hardness exceeding 4000 HV (Vickers hardness) which does not score the cylinder liner, the hardness whereof is considerably lower, generally less than 700 HV (Vickers hardness), or even 250 to 300 HV.

The objects of the present invention are achieved by a sliding element, particularly a piston ring for internal combustion engines provided with a sliding face whereupon there is deposited, from inside outwards, an adhesive layer and a coating of hard amorphous carbon having an Rmr (0.2-0.5) profile greater than at least 25% and/or an Rmr (0.3-0.5) profile exceeding at least 50%.

The objects of the present invention are furthermore achieved by an internal combustion engine comprising at least one piston ring as defined hereinabove.

BRIEF DESCRIPTION OF THE DRAWINGS

The present invention will, hereinafter, be described in greater detail on the basis of an example of embodiment represented in the drawings. The figures show.

DETAILED DESCRIPTION OF THE DRAWINGS

The present invention relates to a sliding element, particularly a piston ring 10 for internal combustion engines comprising a coating 15 of hard amorphous carbon of the ta-C type presenting a roughness profile having Rmr (0.3-0.5) values greater than at least 25% and/or Rmr (0.3-0.5) values greater than at least 50%.

As will be seen below, the roughness profile having a predominance of plateaus 18, when utilized in conjunction with an amorphous carbon coating such as that of the present invention, the generates a performance superior to the sliding elements of the state of the art.

At the outset, it must be stated that the sliding element of the present invention is preferentially a piston ring 10 for internal combustion engines operating with high load and/or power. Generally these piston rings 10 work with very small clearances and a thin film of oil to ensure excellent performance and low emissions of $CO_2$.

As principal characteristics, the piston ring 10 of the present invention has as principal characteristics the low friction of a coating 15 based on a carbon structure having high durability, the result whereof derives from a specially developed topography in the surface of the coating.

Figure 1:
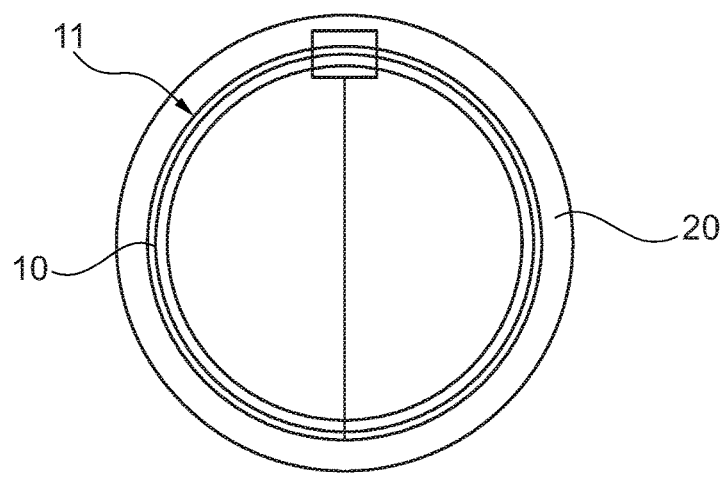
FIG. 1: a representation of the disposition of a piston ring within the interior of a cylinder of an internal combustion engine.

The ring 10 of the present invention, comprising a metal base provided with a sliding face 11, is preferably of cast iron, steel, stainless steel containing from 10% to 17% of chromium or carbon steel. The sliding face 11 is that orientated towards the region of contact with a cylinder liner 20 and upon the sliding face 11 there is deposited the coating 15. In a preferential configuration, the sliding face 11 receives, from inside outwards, an adhesive layer 14 and a coating 15 of hard amorphous carbon of ta-C type (see FIGS. 1 and 2).

The adhesive layer 14 has as objective the bringing about of the accommodation of the stresses between the metal structure of the ring 10 and the coating 15 of amorphous carbon the internal stresses whereof are very high, in this manner ensuring an excellent adhesion between the functional coating 15 and the metal base. In a preferential manner, however not obligatory, the adhesive layer 14 is formed by a body centered cubic (bcc) polycrystalline columnar structure of chromium the thickness whereof lies between 0.5 and 1 micrometer. In an alternative preferential configuration, the adhesive layer may be of nickel or cobalt. Furthermore, the adhesive layer 14 is deposited by a vapor deposition process from a metal source.

Figure 2:
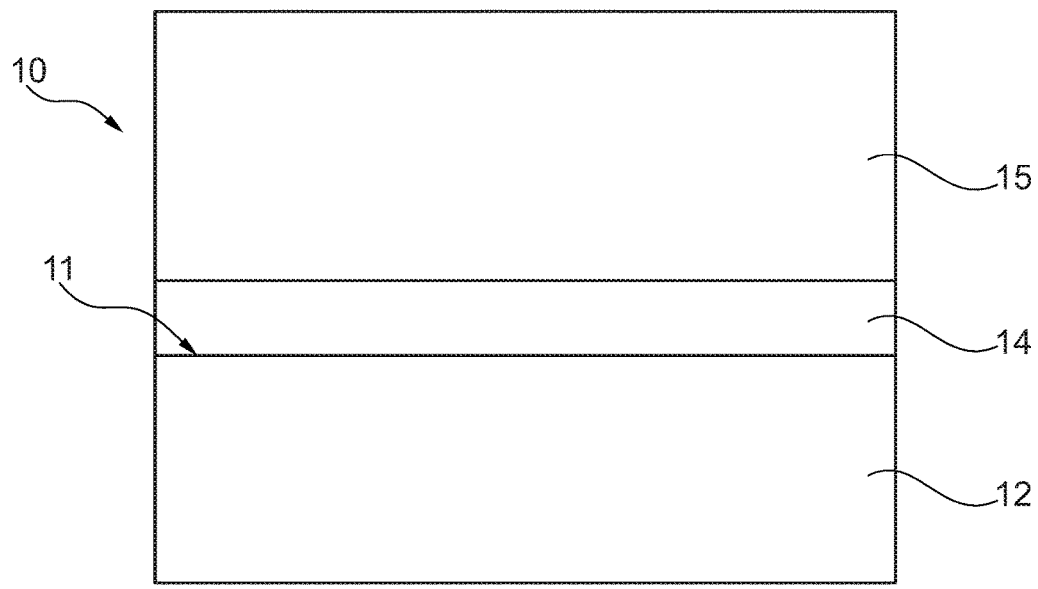
FIG. 2: a cross-section of the piston ring revealing the structure of the coating of the present invention.

In turn, the anti-friction layer, shown in FIG. 2 as coating 15 and hereinafter so designated, is composed of fully amorphous carbon (DLC), free or substantially free of hydrogen, having a predominant quantity of sp3. With respect to the absence of hydrogen, it is important that it be noted that the quantity thereof by weight is less than 2%.

In respect of the proportion of $sp^3$ to $sp^2$ it must be noted that, in a preferential configuration, the proportions thereof comprise in excess of 50% $sp^3$ bonds, characterizing a coating 15 of ta-C. In an alternative preferential configuration, the percentage of $sp^3$ ranges from 55% to 70%. In other words, the ratio of the proportions of $sp^3$ to $sp^2$ ranges from 0.42 to 2.33, it being the case, in a second alternative preferential configuration, that this ratio ranges from 0.70 to 1.50. In this preferential configuration, the high quantity of $sp^3$ in the coating 15, greater than 50%, has the objective of ensuring durability for the working conditions of an engine, by virtue of the fact that the quantity of $sp^3$ is important in respect of the thermal stability of internal combustion engines given that high thermal loads in the engine may cause the transformation of $sp^3$ (diamond type) into $sp^2$ (graphite type).

Furthermore, the total thickness of the film of the present invention ranges between 2 and 25 micrometers, preferentially between 3 and 7 micrometers, wherewith a better relationship between internal stress and thickness of the coating is achieved. In respect of the hardness, the coating 15 of amorphous carbon substantially free of hydrogen comprises a hardness lying between 30 and 50 GPa.

It must furthermore be noted that the process of deposition of the coating 15 occurs by a plasma assisted chemical vapor deposition (PACVD) process.

In a manner differing from the automotive solutions of the state of the art, the present invention utilizes a specially developed topography in the contact surface of the coating 15 capable of being adapted to the contact surface 21 of the cylinder liner 20. The development of the present invention has permitted it to be understood that in many situations of tribological sliding and abrasion contact, the coatings having high roughness present inferior results.

In this manner, the present invention has as object a piston ring 10 provided with a coating 15 comprising a hardness exceeding 4000 HV (Vickers hardness) but avoiding high wear of the cylinder liner 20, the hardness whereof is considerably lower, generally less than 700 HV (Vickers hardness), or even 250 to 300 HV.

To achieve the objects of the present invention, the coating 15 of the piston ring 10 comprises a surface having a controlled quantity of valleys with a view to maximizing the supply of oil during the operation of the starting of the engine, also increasing the oil film and reducing the solid points of contact, yielding a lower coefficient of friction in the tribological system (piston ring/cylinder liner).

Contributing greatly to the excellent results of the present invention, the surface of the coating 15 of the present invention comprises a topography the contact whereof with the contact surface 21 of the said cylinder liner 20 occurs principally by means of plateaus 18.

Figure 3:
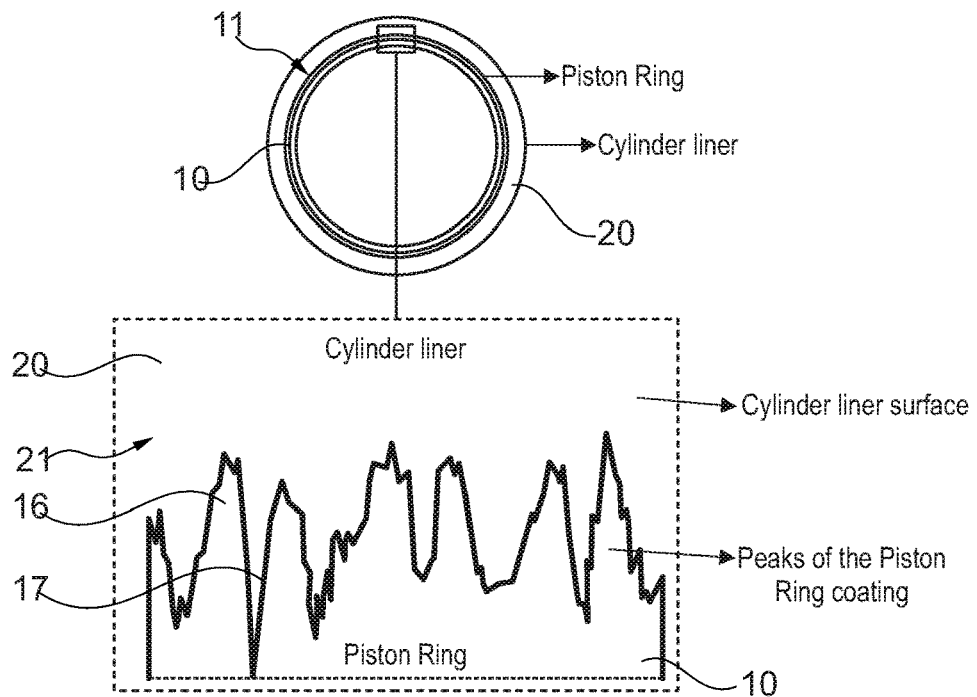
FIG. 3: a drawing representing the points of contact of a cylinder liner and the peaks of a coated piston ring of the state of the art.

ISO 4287 defines the parameters of roughness for the proportion of the surface material (Rmr) reflecting the percentage of material at a given depth measured from a reference line at a given depth. For a better understanding, in terms of example, a comparison of FIGS. 3 and 5 with FIGS. 4 and 6 permits it to be perceived that, when a given topography comprises many peaks 16 (see FIGS. 3 and 5), a reading for a reference line at a distance of 0.2 micrometers generates a lower Rmr value, and a reading for a reference line at a distance of 0.3 micrometers generates a higher Rmr value.

In turn, a topography comprising plateaus 18 instead of peaks 16 generates a higher Rmr (see FIGS. 4 and 6), demonstrating that the proportion of material in the surface is greater. In other words, the graphs of FIGS. 5 and 6 reveal the percentage of material at a given depth measured between the highest peak 16 (0%) and the deepest valley 17 (100%). In this type of analysis, the percentage is obtained drawing a horizontal line at a same distance and at a same depth, determining how much of this line passes through the material in relation to the totality of the length of the line.

Figure 5:
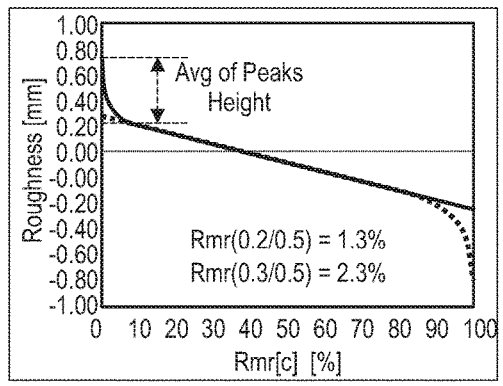
FIG. 5: a graph exemplifying the results from a surface having low Rmr values.
Figure 6:
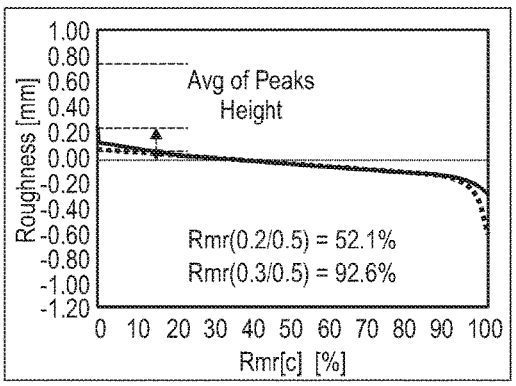
FIG. 6: a graph exemplifying the results from a surface having low Rmr values.

In this manner, FIGS. 5 and 6 permit the difference between a surface having and not having peaks, respectively, to be understood. The present invention makes use of a contact surface very similar to that found in the situation of FIG. 6, i.e. a surface formed substantially by plateaus 18, ensuring good support in the region of contract between the piston ring 10 and the cylinder liner 20. As a result, the more plateaus 18 possessed by a contact region the lower the coefficient of friction will be.

In this manner, the Rmr values are of immense importance to be able to characterize the plateaus 18 of the present invention, by virtue of the fact that such values permit the comprehension of the specific topography, permitting the obtainment of a solution having low friction, high durability, and reduced wear.

In rings of the state of the art, the presence of peaks 16 causes the scoring and critical wear on the wall of the cylinder liner 20 due to the high contact pressure. Furthermore, this high local pressure renders the formation and the maintenance of the film of lubricating oil difficult, even though there is oil present in the valleys 17 of the coating of hydrogen free amorphous carbon (DLC).

Figure 4:
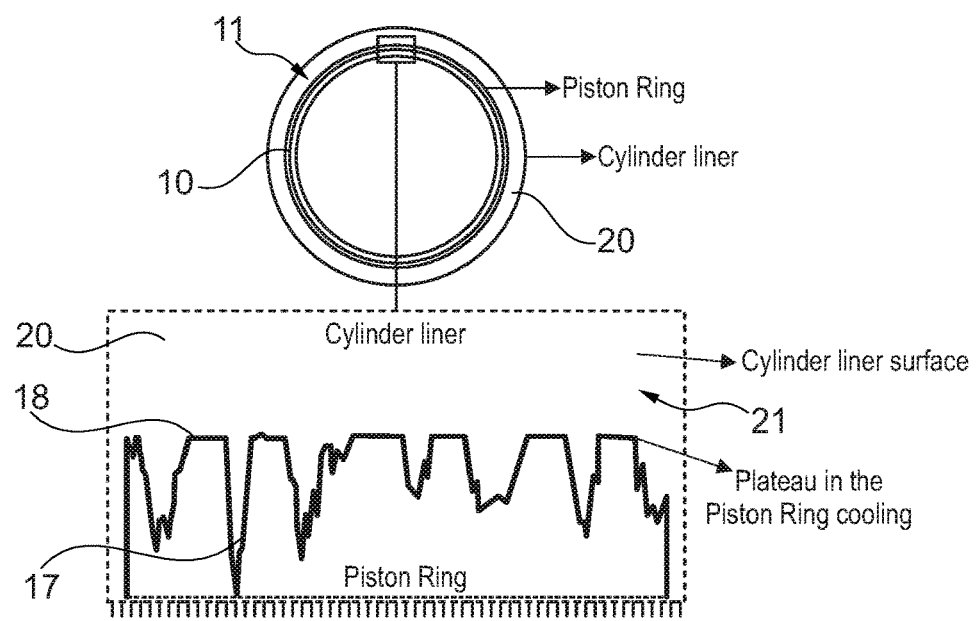
FIG. 4: a drawing representing the points of contact of the cylinder liner and the plateaus of a coated piston ring of the present invention.

The solution of the present invention may be described as being similar to that found in FIG. 4. In this manner, to resolve the problems of the state of the art a surface of plateaus 18 has been developed, having the objective of ensuring good support in the contact between the piston ring 10 and the cylinder liner 20. For the same load, this surface generates a low contact pressure when compared with a topography containing peaks 16. In this manner, the finish of the piston ring 10 is of immense importance for the realization of contact between the ring 10 and the liner 20, such as to contribute to good operation of the engine. The good compatibility between the piston ring 10 and the cylinder liner 20 is obtained by a process of removal of the peaks 16 of the coating 15, this process occurring subsequent to the deposition of the coating 15.

In this sense, the present invention has as characteristic of the topography of the coating 15 of the piston ring 10 the fact that the Rmr (0.2/0.5) value is equal to or exceeds 25% and the Rmr (0.3/0.5) value is equal to or exceeds 50%. In an alternative preferential mode, the Rmr (0.3/0.5) value is equal to or exceeds 65%.

Figure 7:
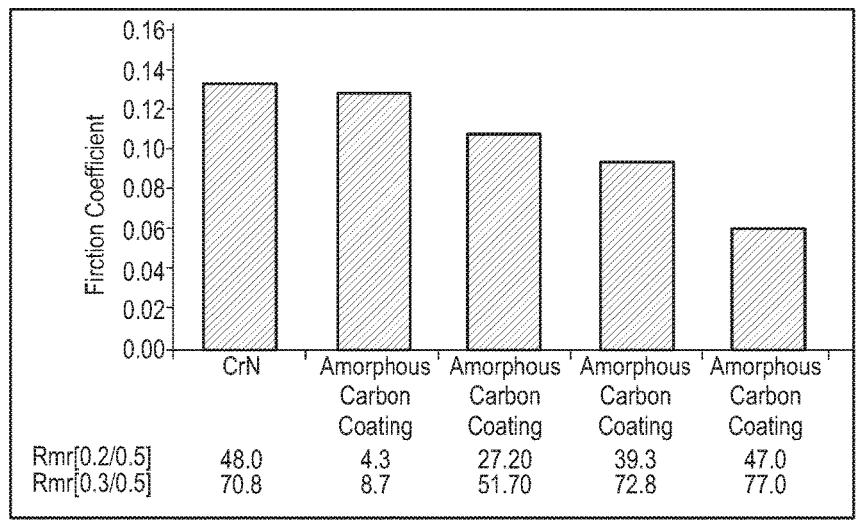
FIG. 7: a graph representing the results of friction as a function of the Rmr values in relation to the state of the art and the present invention.

The laboratory results obtained during the development of the sliding element of the present invention clearly demonstrate the advantages thereof. In this respect, FIG. 7 shows the performance in terms of friction and wear of the piston ring as a function of the Rmr parameters, both for rings of the state of the art and for rings of the present invention. It must be noted that the tests were carried out with the Rmr values within the memorandum, values of Rmr (0.2-0.5) greater than or equal to 25% and of Rmr (0.3-0.5) greater than or equal to 50% being obtained for the present invention.

The results of FIG. 7 show that the coating of substantially hydrogen free amorphous carbon and the coating of chromium nitride present different levels of Rmr. The coefficient of friction of the carbon coatings presents a reduction with the increase in the Rmr percentage. In turn, the values further to the right in the table of FIG. 7 reveal that the coating of the present invention of DLC and the coating of CrN present substantially the same Rmr values. In all cases, the coating of DLC of the present invention presents a coefficient of friction substantially 50% lower than the coating of CrN.

Figure 8:
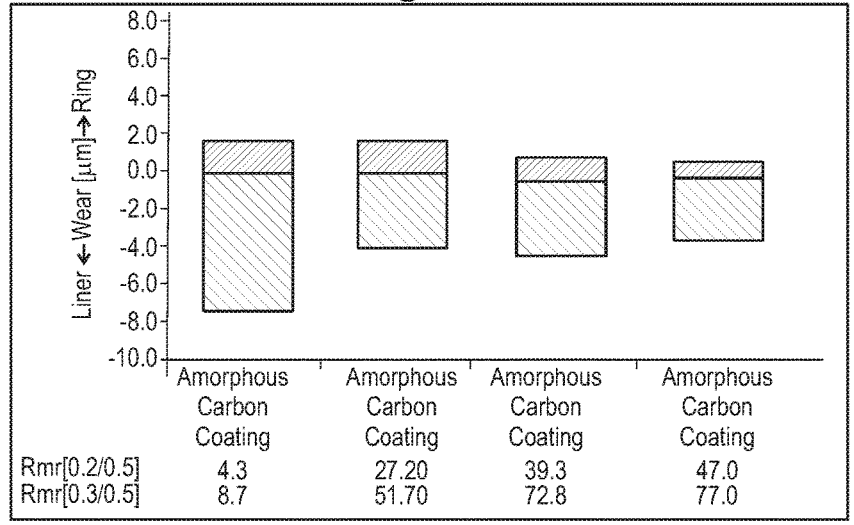
FIG. 8: a graph representing the wear of the ring and of the cylinder liner for diverse types of coatings of amorphous carbon as a function of the Rmr values.

FIG. 8 furthermore shows the performance in terms of the wear of diverse coatings of DLC of the present invention compared with a coating of DLC of the state of the art. The results demonstrate the advantage of the solution of the present invention by virtue of revealing that the presence of plateaus 18 of the present invention (higher Rmr values) brings about less wear on the piston ring 10 (columns above zero) and less wear on the cylinder liner 20 (columns below zero). In other words, for amorphous carbon coatings, when the Rmr values attain the topographical profile of the present invention, the wear both of the piston ring 10 and of the cylinder liner 20 is much lower.

Consequently, no doubts remain that the present invention, on combining the use of coatings 15 of substantially hydrogen free amorphous carbon having a topology presenting a high Rmr profile where the contact with the cylinder liner is maintained principally by plateaus 18, the coefficient of friction is greatly reduced and the wear both of the ring and of the cylinder is also reduced, ensuring the correct behavior at any stage of functioning of the engine and ensuring a long life for the engines.

An example of preferred embodiment having been described, it shall be understood that the scope of the present invention covers other possible variations, being limited solely by the content of the appended claims, therein included the possible equivalents.

The invention claimed is:

1. A sliding element for internal combustion engines, comprising a sliding face upon which are deposited, from the sliding face outwards, an adhesive layer and a coating of hard amorphous carbon, wherein the coating presents a proportion of $sp^3$ to $sp^2$ ranging from 0.42 to 2.33 and at least one of an Rmr (0.2-0.5) profile greater than at least 25% and an Rmr (0.3-0.5) profile greater than at least 50%, the at least one of an Rmr (0.2-0.5) profile and an Rmr (0.3-0.5) profile having a majority formed by plateaus.

2. The sliding element as claimed in claim 1 wherein the coating contains less than 2% by weight of hydrogen.

3. The sliding element as claimed in claim 1, wherein the coating is of a ta-C type and includes $sp^3$ bonds exceeding 50%.

4. The sliding element as claimed in claim 1, wherein the coating is of a type a-C and includes $sp^3$ bonds having $sp^3$ values between 25% and 45%.

5. The sliding element as claimed in claim 1, wherein the Rmr (0.2) is at least 25% and/or the Rmr (0.3) is at least 65%.

6. The sliding element as claimed in claim 1, wherein a thickness of the coating ranges from 2 micrometers to 25 micrometers.

7. The sliding element as claimed in claim 1, wherein a thickness of the coating ranges between 3 micrometers and 8 micrometers.

8. The sliding element as claimed in claim 1, wherein the adhesive layer is of chromium metal having a body centered cubic structure of one of nickel and cobalt.

9. The sliding element as claimed in claim 1, wherein a hardness of the coating ranges between 30 and 50 GPa.

10. The sliding element as claimed in claim 1, a base material of the sliding element consists of a stainless steel having 10% to 17% of chromium, the remainder being cast iron and carbon steel.

11. An internal combustion engine comprising at least one piston ring having a sliding face upon which are deposited, from the sliding face outwards, an adhesive layer and a coating of hard amorphous carbon deposited on the adhesive layer, wherein the coating presents a proportion of $sp^3$ to $sp^2$ ranging from 0.42 to 2.33 and at least one of an Rmr (0.2-0.5) profile greater than at least 25% and/or an Rmr (0.3-0.5) profile greater than at least 50%, the at least one of an Rmr (0.2-0.5) profile and an Rmr (0.3-0.5) profile having a majority formed by plateaus.

12. The internal combustion engine as claimed in claim 11, wherein the coating contains less than 2% by weight of hydrogen.

13. The internal combustion engine as claimed in claim 11, wherein the coating is of a ta-C type and includes $sp^3$ bonds exceeding 50%.

14. The internal combustion engine as claimed in claim 11, wherein the coating is of a type a-C and includes $sp^3$ bonds having $sp^3$ values between 25% and 45%.

15. The internal combustion engine as claimed in claim 11, wherein the Rmr (0.2) is at least 25% and/or the Rmr (0.3) is at least 65%.

16. The internal combustion engine as claimed in claim 11, wherein a thickness of the coating ranges from 2 micrometers to 25 micrometers.

17. The internal combustion engine as claimed in claim 11, wherein a thickness of the coating ranges between 3 micrometers and 8 micrometers.

18. The internal combustion engine as claimed in claim 11, wherein the adhesive layer is of chromium metal having a body centered cubic structure of one of nickel and cobalt.

19. The internal combustion engine as claimed in claim 11, wherein a hardness of the coating ranges between 30 and 50 GPa.

20. A piston ring comprising:
a base material having a sliding face upon which are deposited, from the sliding face outwards, an adhesive layer and a coating of hard amorphous carbon;
wherein the coating presents a proportion of $sp^3$ to $sp^2$ ranging from 0.42 to 2.33 and at least one of an Rmr (0.2-0.5) profile greater than at least 25% and/or an Rmr (0.3-0.5) profile greater than at least 50%, the at least one of an Rmr (0.2-0.5) profile and an Rmr (0.3-0.5) profile having a majority formed by plateaus;
wherein the coating is one of a ta-C type including $sp^3$ bonds exceeding 50%, and an a-C type including $sp^3$ bonds between 25% and 45%.

* * * * *